（12）United States Patent
Shepard

(10) Patent No.: US 8,934,293 B1
(45) Date of Patent: Jan. 13, 2015

(54) MEANS AND METHOD FOR OPERATING A RESISTIVE ARRAY

(75) Inventor: Daniel Robert Shepard, North Hampton, NH (US)

(73) Assignee: Contour Semiconductor, Inc., North Billerica, MA (US)

( * ) Notice: Subject to any disclaimer, the term of this patent is extended or adjusted under 35 U.S.C. 154(b) by 301 days.

(21) Appl. No.: 13/135,235

(22) Filed: Jun. 29, 2011

Related U.S. Application Data

(60) Provisional application No. 61/398,632, filed on Jun. 29, 2010.

(51) Int. Cl.
*G11C 11/00* (2006.01)
(52) U.S. Cl.
USPC ........................................................ 365/163
(58) Field of Classification Search
CPC .......... G11C 13/0004; G11C 11/5678; G11C 13/004; G11C 13/0069
USPC .......................... 365/163, 148, 157, 159, 158
See application file for complete search history.

(56) References Cited

U.S. PATENT DOCUMENTS

| | | | |
|---|---|---|---|
| 2007/0268742 A1* | 11/2007 | Liu ................................ | 365/163 |
| 2008/0025132 A1* | 1/2008 | Fasoli et al. .............. | 365/230.06 |
| 2010/0020618 A1* | 1/2010 | Kim et al. ................ | 365/185.23 |
| 2010/0046273 A1* | 2/2010 | Azuma et al. .................. | 365/148 |
| 2010/0182866 A1* | 7/2010 | Kim et al. ...................... | 365/226 |
| 2011/0188289 A1* | 8/2011 | Chevallier et al. ............ | 365/148 |

* cited by examiner

*Primary Examiner* — VanThu Nguyen
*Assistant Examiner* — Khamdan Alrobaie
(74) *Attorney, Agent, or Firm* — Morgan, Lewis & Bockius LLP

(57) ABSTRACT

The present invention is a means and method for constructing and operating a 3-D array and, more particularly, a 3-D memory array. This array can be manufactured as a monolithic integrated circuit at low cost by virtue of the limited number of steps per layer of memory elements. The low number of steps results by having the storage elements separated by a resistive component as opposed to an active component. The 3-D array is in essence, an array of 2-D resistive arrays (row-planes) having a long dimension (typically along the rows) and a short dimension (typically in the direction of the stacked layers). Any one row-plane can be isolated from the rest and be accessed independently from all of the other row-planes in the 3-D array. This makes it possible to operate and analyze a single row-plane as a mostly stand-alone circuit. The present invention lends itself to single bit accesses as well as simultaneous multiple bit accesses.

13 Claims, 8 Drawing Sheets

| Post | 16 | 15 | 14 | 13 | 12 | 11 | 10 | 9 | 8 | 7 | 6 | 5 | 4 | 3 | 2 | 1 | Op-amp |
|---|---|---|---|---|---|---|---|---|---|---|---|---|---|---|---|---|---|
| Applied Post Voltage (mV) | 0.00 | 500.01 | 500.02 | 500.03 | 500.04 | 500.05 | 500.06 | 500.07 | 500.08 | 500.09 | 500.10 | 500.11 | 500.12 | 500.13 | 500.14 | 500.15 | |
| Row Voltage (mV) | 500.00 | 500.01 | 500.02 | 500.03 | 500.04 | 500.05 | 500.06 | 500.07 | 500.08 | 500.09 | 500.10 | 500.11 | 500.12 | 500.13 | 500.14 | 500.15 | 500.16 |
| Memory Element Resistance (Ω) | 10K | 10K | 10K | 10K | 10K | 10K | 10K | 10K | 10K | 10K | 10K | 10K | 10K | 10K | 10K | 10K | |
| Memory Element Current (µA) | 50 | 0 | 0 | 0 | 0 | 0 | 0 | 0 | 0 | 0 | 0 | 0 | 0 | 0 | 0 | 0 | 0 |

Assumptions: selected memory element resistance 10KΩ, op-amp feedback resistor 10KΩ, Op-amp(+) voltage 500.16mV, Post 16 selected Memory element guess correct (10KΩ) and all other elements at worst case values of 10KΩ

Output: 50µA into row @ op-amp(+) for op-amp output of 0.5V

Figure 5

| Post | 16 | 15 | 14 | 13 | 12 | 11 | 10 | 9 | 8 | 7 | 6 | 5 | 4 | 3 | 2 | 1 | Op-amp |
|---|---|---|---|---|---|---|---|---|---|---|---|---|---|---|---|---|---|
| Applied Post Voltage (mV) | 0.00 | 500.01 | 500.02 | 500.03 | 500.04 | 500.05 | 500.06 | 500.07 | 500.08 | 500.09 | 500.10 | 500.11 | 500.12 | 500.13 | 500.14 | 500.15 | |
| Row Voltage (mV) | 500.158 | 500.158 | 500.158 | 500.159 | 500.159 | 500.159 | 500.159 | 500.159 | 500.159 | 500.159 | 500.159 | 500.159 | 500.160 | 500.160 | 500.160 | 500.160 | |
| Memory Element Resistance ($\Omega$) | 1M | 10K | 10K | 10K | 10K | 10K | 10K | 10K | 10K | 10K | 10K | 10K | 10K | 10K | 10K | 10K | |
| Memory Element Current (A) | 5.0E-7 | 1.5E-8 | 1.4E-8 | 1.3E-8 | 1.2E-8 | 1.1E-8 | 9.9E-9 | 8.9E-9 | 7.9E-9 | 6.9E-9 | 5.9E-9 | 4.9E-9 | 4.0E-9 | 3.0E-9 | 2.0E-9 | 9.9E-10 | |

Assumptions: selected memory element resistance 10K$\Omega$, op-amp feedback resistor 10K$\Omega$, Op-amp(+) voltage 500.16mV, Post 16 selected Memory element guess incorrect (1M$\Omega$ as opposed to guess of 10K$\Omega$) and all other elements at worst case values of 10K$\Omega$ Output: 6.19E-7 A into row @ op-amp(+) for op-amp output of 6.187mV

Figure 6

MEANS AND METHOD FOR OPERATING A RESISTIVE ARRAY

CROSS REFERENCE TO RELATED APPLICATIONS

This application claims priority to and benefit of U.S. Provisional Patent Application Ser. No. 61/398,632, filed on Jun. 29, 2010, which is incorporated herein by reference.

FIELD OF THE INVENTION

The present invention relates to semiconductor storage arrays, and more particularly to resistor arrays having two or three dimensions.

REFERENCE TO A SEQUENCE LISTING, A TABLE, OR A COMPUTER PROGRAM LISTING COMPACT DISK APPENDIX

Not Applicable.

REFERENCE REGARDING FEDERAL SPONSORSHIP

Not Applicable.

STATEMENT REGARDING FEDERALLY SPONSORED RESEARCH OR DEVELOPMENT

Not Applicable.

SUMMARY OF THE INVENTION

The present invention is a means and method for constructing and operating a 3-D array and, more particularly, a 3-D memory array. This array is intended to be manufacturable at low cost by virtue of the limited number of steps per layer of memory elements. The low number of steps results by having the storage elements separated by a resistive component as opposed to an active component. These storage elements are stacked vertically above a memory cell switch in the substrate. This switch is selected by x and y decoding of the row and column bits in the memory address. The present invention lends itself to single bit accesses as well as simultaneous multiple bit accesses.

In a 3-D array such as a memory array, rows extend in the x direction, columns extend in the y directions, and the layers are stacked in the z direction. Conductive elements (i.e., wires) extending in the z direction are referred to as posts.

Columns exist only in the foundation for the purpose of identifying a line of posts. Columns are not found in the layers of the array. Posts extend upwards from their respective column and through the layers of the array. To select a post, one must choose a column which will in turn select all of the posts extending upwardly from that column (i.e., choosing a column selects all of the posts upon that chosen column) or that column could enable a switch at the base of every post. A column choice is identified by a value on the x-axis.

Rows, on the other hand, are found within the layers of the array (and not in the foundation). The rows are orthogonal to both the columns and the posts. Any set of rows that are all positioned vertically one above each other form a two-dimensional plane and are called a row-plane and a row-plane includes one row from every layer in making such a vertical collection of rows. A row-plane choice is identified by a value on the y-axis. FIG. 4 depicts a schematic for a row-plane in which layers are labeled A through D (the z-axis) and posts are labeled 1 through 16.

By choosing a column and a row-plane, a single post will be selected at the intersection of that column and row-plane. By choosing a particular layer in addition to a post (i.e., a row-plane and a column), a single bit will be selected at the point of intersection of the chosen row on the chosen level with a post on the chosen column. A layer choice is identified by a value on the z-axis.

The present invention is a 3-D array (or greater, multi-dimensional array) in which a switching element can exist at the end of the column or more likely exists at the bottom of each post (e.g., proximate to the connection of a post to a column). In this way, any one row-plane can be isolated from the rest and be accessed independently from all of the other row-planes in the 3-D array. This makes it possible to operate and analyze a single row-plane as a mostly stand-alone circuit. This makes it possible to operate and analyze a single two-dimensional plane (a row-plane) out of multi-dimensional (2-D, 3-D or greater) array as a mostly stand-alone circuit.

BRIEF DESCRIPTION OF THE DRAWINGS

FIG. 5 shows a table of voltage calculations having a correct guess for the selected memory element.

FIG. 6 shows a table of voltage calculations having an incorrect guess for the selected memory element.

DESCRIPTION OF THE PREFERRED EMBODIMENT

Figure 1:
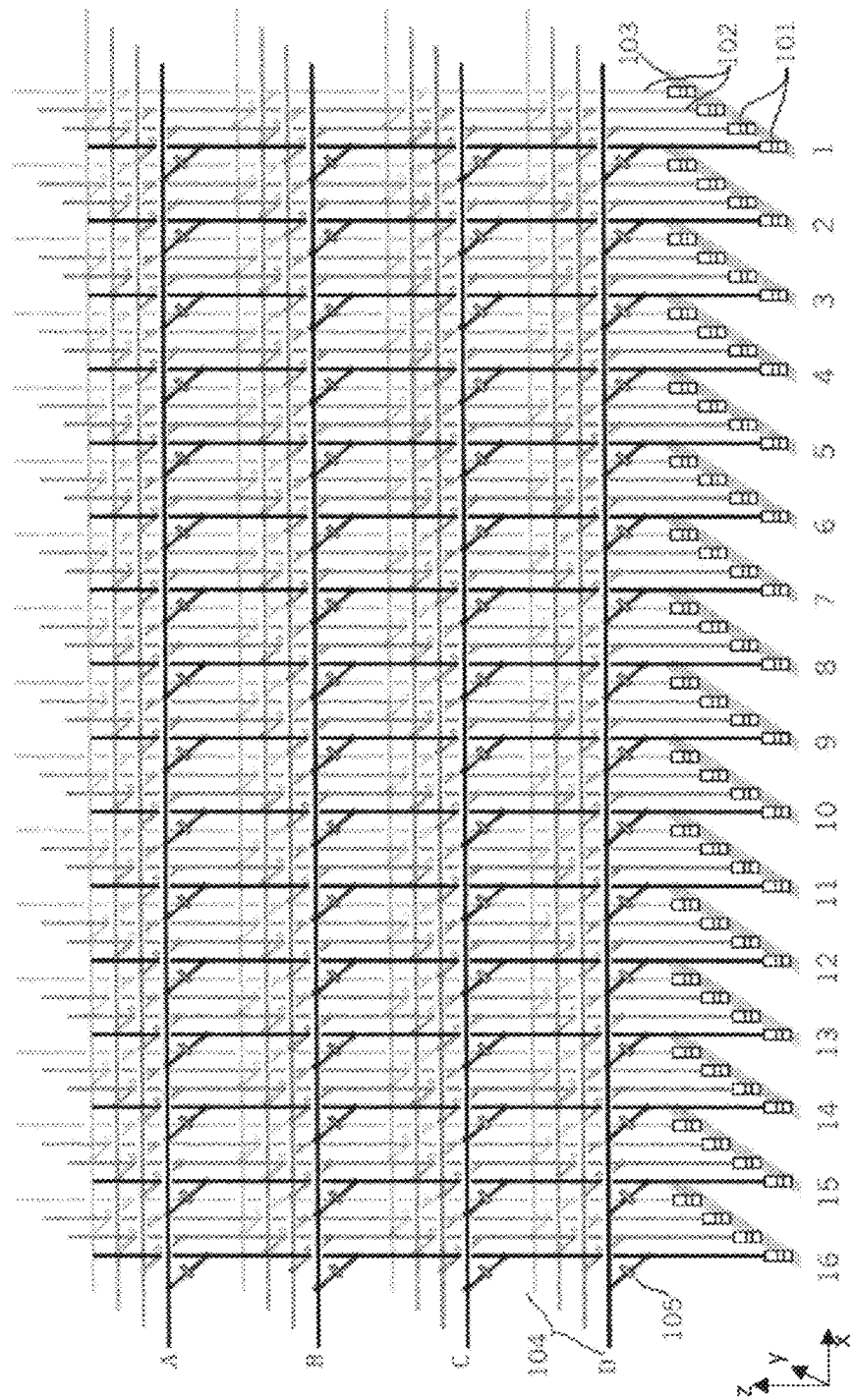
FIG. 1 depicts a 4 layer by 4 row by 16 column 3-D array.

FIG. 1 Depicts a 3-D Memory Array. The present invention is a 3-D array in which a switching element 101 exists at the bottom of each post 102 (e.g., proximate to the connection of a post 102 to a column 103). In this way, any one vertical row-plane can be isolated from the rest and be accessed independently from all of the other row-planes in the 3-D array. This makes it possible to operate and analyze a single row-plane as a mostly stand-alone circuit.

A variety of switching elements 101 are contemplated by the present teaching and include rectification devices of many types (including diodes, SCR's, OTS devices, four-layer diodes, and the like), switches of many types (including MOS, bipolar, unijunction and other types of transistors, organic switches, and the like), and other current controlling devices. It is not intended to limit the present teaching to any one type of current controlling device.

Because of the economics of semiconductor manufacturing and processing, the layers 104 will typically be far fewer in number than the row-planes and columns. As a result, analysis of a single row-plane will typically consist of the analysis of a resistive array that is large in one dimension (the posts along the x-axis) and small in the other (the layers in the z-axis). In other words, the post length typically will be small relative to the row length which will be long.

Typically, an actual array will have many more rows and columns, but for the sake of the present discussion, a small array is depicted. Generally speaking, the three dimensional memory or information storage array is made up of a plurality of vertically oriented two-dimensional arrays (row-planes) that are generally parallel to each other. These two-dimensional arrays consist of multiple, parallel conductive lines (herein called posts) that are connected to current controlling, switch devices in the substrate (such as bipolar or MOS transistors, SCR's, or the like). The posts pass through the layers 104 of memory. Each layer within a row-plane has a conductive line and the memory bits (information storage elements 105) are positioned roughly where the posts intersect the conductive line of each layer.

Figure 2:
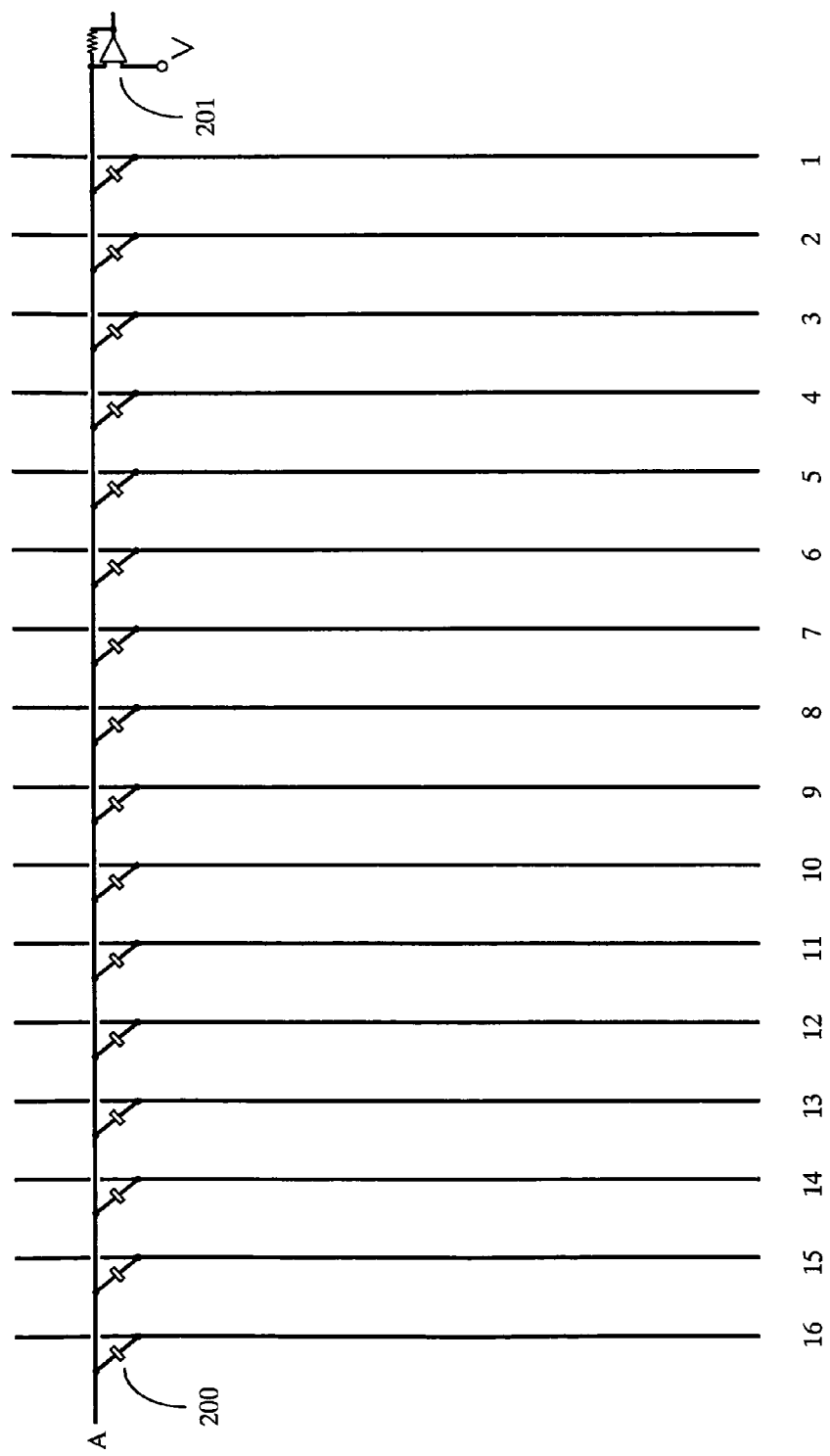
FIG. 2 depicts a partial schematic showing one row and 16 posts.

FIG. 2 depicts a partial schematic showing one row (A) and 16 posts. A resistive change memory element, 200, is present at each node or point of crossing between a row and a post. At the end of the row (A), a current measuring circuit, 201, is provided (shown as a simple op-amp sensor with negative feedback as is well understood by those skilled in the art). With the positive input to the op-amp set to a voltage, V, the right hand end of row (A) will also be maintained at this voltage potential, V. With no voltage applied to any post, row (A) will have no loading and no current will be flowing so all points along row (A) will also be at voltage potential, V. If a voltage is applied to any one post, a small current will flow and the output of the op-amp will fluctuate in proportion to that current (as a function of the feedback resistor of the op-amp and the resistance of the memory element at the node). The resistance of the row line and the selected post will also contribute to the output value. Since the post is short and its resistance will be small relative to the resistance of the memory element, 200, the post resistance is being ignored for this initial analysis.

If ground potential is applied to post 16 (with all the other posts floating), the resulting current, I, will be equal to V/(R+r) where R is the resistance of the memory element and r is the resistance of row (A) from approximately that point where row (A) crosses post 16 to the input of the op-amp. The resistance of any segment of row (A) from one post to the next post will be (r/16) and the voltage drop across any such segment will therefore be (I×r/16). With these equations in mind, the voltage along row (A) at every post can be calculated. One could let the voltage on each of the unselected posts continue to float, but in the alternative, one could apply these computed voltages along row (A) proximate to each post (bias voltages) to each unselected post (such that there should be no voltage potential across any of the unselected memory elements) and the output should be unchanged and no additional current will flow.

In determining the calculated voltage values, one would (a) decide upon the voltage to be asserted on the selected post (here, 0V is to be applied to post 16); (b) knowing the desired current to flow through the selected memory element (here, 50 μA) given a particular resistance for that memory element (here, 10KΩ) and, based on that desired current for that resistance, calculate the required voltage across memory element A-16 (here, 0.5V) to yield that current for that resistance; (c) having determined the voltage on the post (0.0V) and the voltage across the memory element (0.5V), calculate the voltage on row (A) at the selected post (here, 0.0V+0.5V=0.5V); (d) compute the resistance of the row (A) from the op-amp to the point on row (A) at the selected post (if each segment has a resistance of 0.2Ω, then the row (A) resistance is 0.2Ω×16 segments=3.2Ω); (d) assuming that no current flows into any of the unselected elements on that row (i.e., all of the current that flows through the voltage element must therefore flow from the point on row (A) at the selected post to the op-amp), determine the voltage drop from the point on row (A) at the selected post to the op-amp (here, the drop is 50 μA×3.2Ω=0.160 mV); and finally, (e) determine the voltage necessary at the op-amp by adding the voltage drop along the length of the row (A) to the voltage on the row (A) at the selected post (here, 0.160 mV+0.5V=500.16 mV); and finally (f) continuing with the assumption that no current flows into any of the unselected elements on that row, determine the voltage on row (A) at each post using Ohm's Law for voltage dividers: if row (A) has a resistance of 0.2Ω per segment (between two posts or between post 1 and the op-amp) and a current of 50 μA, the voltage across any segment will be 10 μV and the voltage on row (A) at each post (1 through 16, respectively) will be 500.16 mV at the op-amp, 500.15 mV at post 1, 500.14 mV at post 2, and so forth until post 16 at which point the voltage will be 500.00 mV. Having calculated the voltages on row (A) at each post, these same voltages can be externally applied to the posts 1 through 15, respectfully, and no voltage potential will appear across any of the memory elements A-1 through A-15 and no current will flow from row (A) into any of the unselected posts (consistent with the assumption at (d)). The op-amp output value when all the unselected posts are floating is the same for when these calculated voltages are applied to each post. In FIG. 5, the calculations for this example have been summarized in a table.

The above example presumes that the resistance of (i.e., the value stored in) the targeted memory element (A-16) is known to begin with. Since the resistance of the storage element (A-16) would not be known at the start of a read operation, the exact voltages to apply to the posts would not be known either to eliminate current flowing into any of the unselected posts (this will also be true when the correct resistance is assumed, but to a lesser extent, due to process variations, natural variations in the resistance of the memory element, device aging effects, and the like). However, if one assumed the state that the memory element was in (of its two possible states as would be the case with a single level cell (SLC) type of memory element), one could then calculate (as done above) the post voltages based on this assumption and predict the output value from the op-amp. If one assumed the correct memory element state, the output should be as predicted; if the prediction is incorrect, then the other memory element state could be concluded. During a write or erase operation, the additional complexity of voltage threshold and snapback on the memory element as described below, can occur, depending on the memory element characteristics.

Note that when a post other than the left most (i.e., farther away from the op-amp than the selected post) is selected, all posts to the left of that selected post should be biased to that voltage computed to be on row (A) at the selected post point (in order to ensure that no currents are flowing in row (A) to the left of the selected post). To simplify the biasing of unselected posts to the left of the selected post, the voltage, V, at the + terminal of the op-amp could be adjusted downward such that the voltage on row (A) at the selected post will always be the same (however, this voltage adjustment is not required as other compensating calculations and adjustments could be made); this voltage adjustment simplifies the voltage calculations and settings (then the voltage to apply to all the posts to the left of the selected post will always be the same voltage as well). This downward adjustment should equal the voltage drop across the posts to the left of the selected post that would have occurred had the left most post been selected. In our example, if post 11 were now the selected post and grounded, there will be five unselected posts to the left of post 11, across each of which a voltage of 10 μV would have fallen if post 16 had been selected, so V should be adjusted down by 5×10 μV or a 50 μV downward adjustment. This will result in an adjusted V of 110 μV and the voltage on row (A) at post 11 will be 500.00 mV (the same voltage on row (A) at the selected post as was calculated when the selected post was post 16) and posts 12 through 16 would also be biased to 500.00 mV. With the voltage on row (A) at post 11 being 500.00 mV and all the unselected posts to the left of post 11 biased at 500.00 mV, it is clear that there will be no current flowing to the left of selected post 11.

If, as was described for the voltage calculations for FIG. 2, there is no current flowing from a given row to any of the unselected posts (i.e., the voltage on the row at each post was matched by the voltage applied to each respective post), there will be no current leaking into any of the unselected posts. On the other hand, if in calculating the voltages for FIG. 2, the assumption of the resistance for the selected memory element were incorrect (i.e., one assumed the wrong resistance value), then the voltage on the row (A) at any given post would differ slightly from the voltage computed and applied to each unselected post and a small amount of current will leak from the row (A) into those unselected posts. This small leaking current, in total, could result in a current flow that approaches the current expected to be flowing through the selected memory element for the assumed resistance; if this occurs, this leaking current could cause a misread at the op-amp output. For example, if one assumed the lowest possible resistance value for the selected memory element and that assumption turned out to be wrong (e.g., the resistance value was actually the highest possible resistance value, and as a result, the voltage on the row (A) at the selected post would be loaded down much less than assumed), then the voltage on the row (A) at the selected post would be higher than assumed and the voltage on the row (A) at every unselected post would also be higher than assumed.

Ideally, the voltage across an unselected memory element would be zero and no current will flow through the unselected element; in the next best case, the unselected elements would be in their highest resistance state such that, while not at zero current, the smallest current will flow through the unselected elements. In a worst case scenario, all of the unselected memory elements would be in their lowest resistance state resulting in the greatest current flowing into each unselected post (due to those slightly higher voltages at each unselected post). In FIG. 6, the calculations for this example, in which the assumed resistance value for the selected memory element is incorrect, have been summarized in a table.

As the number of posts in the circuit increases, the total of these leaking currents will also increase and as this total converges on the current expected to be flowing through the selected memory element for the assumed resistance, the margin for reading will be reduced. Several techniques can be considered for determining if the resistance assumed for the selected memory element was the correct assumption. The current flowing through the selected post could be measured to determine if that current is consistent with the resistance assumption. Alternatively, the current flowing through one or more (or the total through all) of the unselected posts could be measured to determine if current is or is not flowing to confirm whether or not the resistance assumption was correct. Alternatively, the opposite resistance value for the selected memory element could be assumed, (which would presumably be the correct resistance value causing the leaking currents to be greatly reduced or eliminated), and new voltages for the unselected posts could be computed and applied. In this latter case, the unselected post voltages could be stepped such that first the voltages corresponding to a low selected memory element resistance are applied and then the voltages corresponding to a high selected memory element resistance are applied. It should be noted that the leaking currents to the unselected posts can cause a shift in the voltage applied to those unselected posts if the impedance of the source of those voltages is large; this can become an issue with sneak paths when there is more than one layer in the array (e.g., a 3-D array) as will be discussed, below.

Figure 7:
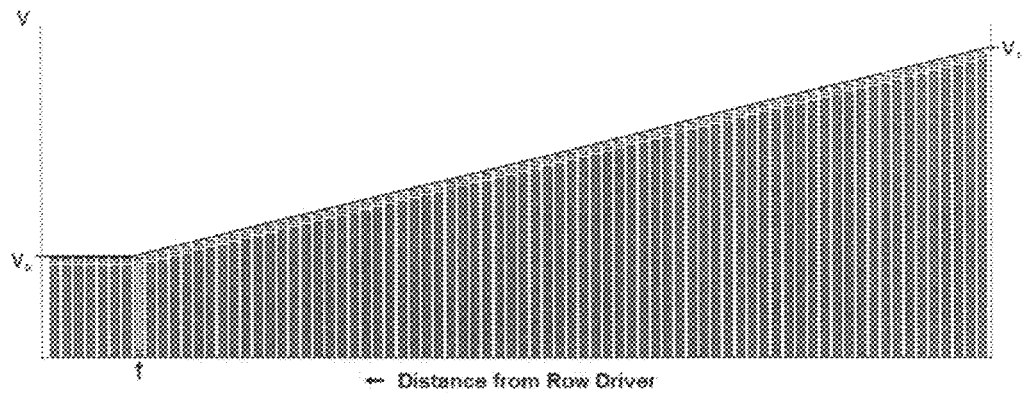
FIG. 7 is a graph depicting voltages on the columns and on a selected Row while reading when the selected column in farther from the row driver.

Put another way, since the row has a finite resistance, there will be a voltage drop along the row from the op-amp row driver at the end of the row to the point along the row where it crosses the selected post that is sinking to ground and a graph of these voltages is shown in FIG. 7. In this graph, the op-amp is on the right where $V_X$ is applied and the drop in that voltage is shown as the line extending from right to left having a downward slope to the selected post (shown by an upward pointing arrow below the x-axis). To the left of the selected post, this line is flat because there is no additional loading beyond the selected post. At the point of the selected post, the voltage across the information storage element is shown and is represented by the lighter gray bar where the height of the bar corresponds to the voltage across the element. [Note, the graph is representative of the voltages for the purpose of the present discussion but it does not represent actual scale.] The darker gray bar below the lighter gray bar represents the voltage on the post. The small dark bar represents the voltage slightly above ground corresponding to the selected post. Therefore, for all the unselected posts, the darker gray bar in the graph represents a voltage corresponding to the value experienced on the row at each post's respective crossing point and the small gray bar on top represents a voltage across the information storage element of approximately zero. It should be again noted that with a zero potential across the information storage element of each of the unselected posts, the resistance value of those information storage elements is inconsequential.

Figure 8:
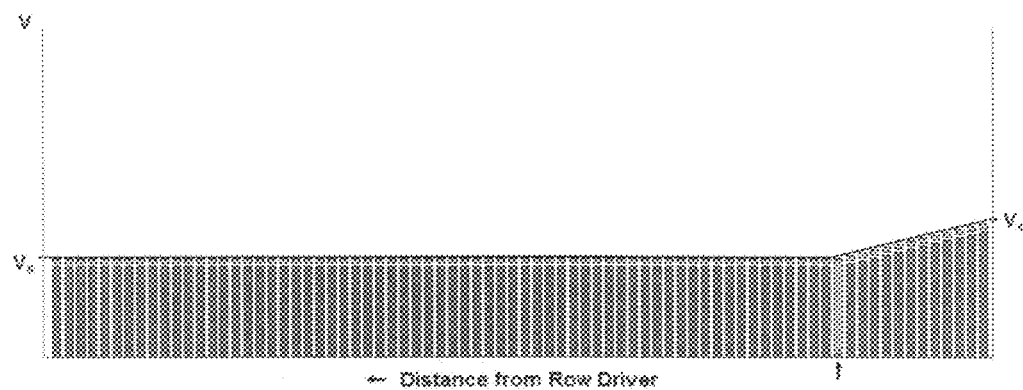
FIG. 8 is a graph depicting voltages on the columns and on a selected Row while reading when the selected column is closer to the row driver.

To read the information storage element at the targeted location, $V_X$ is set as a function of the distance away from the end of the row to the selected post such that the read voltage ($V_R$) occurs on the row at the point of intersection of the row with the selected post (as well as at every point from that selected post to the end of the row away from the op-amp). If the selected post is closer to the op-amp (i.e., closer to the right end of the row) as shown in FIG. 8, the applied voltage $V_X$ is correspondingly lowered such that $V_R$ remains at the same level. $V_X$ is determined using an assumption of the resistance value of the information storage element at the targeted memory cell. The slope of the line is a function of the resistance of the row and the current through that row and this current is a function of the resistance of the selected information storage element, among other things, and the information storage element has a range of resistance values—for a single level cell (SLC) this resistance value will be either high (about 100KΩ to 1MΩ) or low (about 10KΩ). Since in the ideal case, the voltage across all of the unselected information storage elements is zero when the assumed resistance of the targeted information storage element is exactly right, those unselected elements could in theory have any resistance value from zero (a short circuit) to infinity (an opened circuit) because no current flows through them. But, if the actual resistance value for the targeted element is greater than the assumed resistance value, the actual voltage $V_A$ will be greater than the computed voltage $V_A$ (by how much greater is a function of the loading by the unselected elements, but $V_R$ will never be lower than the computed value). If actual voltage $V_R$ is much greater than the calculated voltage $V_R$, then both the selected element must be higher than its assumed resistance value and the loading by the unselected elements must be low (i.e., the data bit state is known). However, if the actual voltage $V_R$ is about equal to the calculated voltage $V_A$ (leakage currents will typically keep the voltage from being exact), then either the selected information storage element is in the assumed resistance state or the selected element is in the opposite state but the unselected elements are heavily loading the row line (i.e., the data bit state is ambiguous). Since the unselected information storage elements are all biased by posts that are set to voltages that are equal to or greater than $V_R$, then there must be significant loading and the current flowing through the unselected elements must be greater than when the current is only flowing through the selected element (when its resistance is as was assumed in which case no current would be flowing through the unselected elements—the data bit state, with the inclusion of a current measurement, is not ambiguous). Finally, when $V_X$ is close to $V_R$ (i.e., when the selected column is close to the op-amp end of the row), there can be little loading by the unselected elements and presence the current flowing would indicate that the selected element is in the assumed low resistance state as assumed.

Within the 3-D array is a plurality of 2-D resistive arrays (a row-plane is a 2-D resistive array comprising rows on one dimension and posts on the other). One of the limiting mechanisms in a resistive array is sneak paths. In the present invention, sneak paths are addressed by controlling the voltage on the posts.

Figure 3:
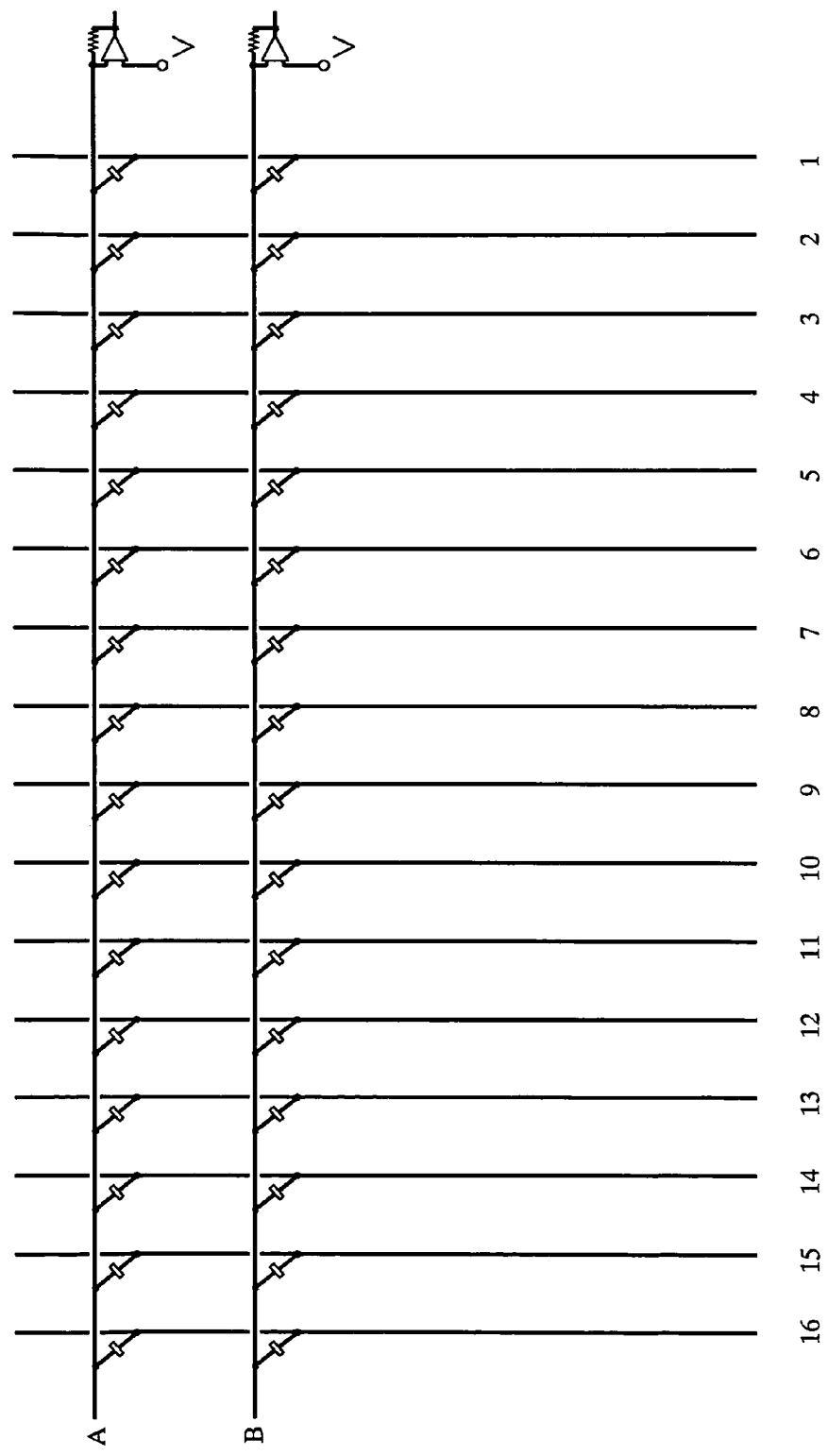
FIG. 3 depicts a partial schematic showing two rows and 16 posts.

FIG. 3 depicts a partial schematic showing a second row (B) and 16 posts. In this case, the same procedure is performed for reading both rows simultaneously. The post voltages are applied assuming both of the memory elements on any given post (one to row (A) and one to row (B)) are in a particular state and the op-amp outputs (as a function of the current flowing from each op-amp into its respective row and the feedback resistor as is well understood by those skilled in the art) would each be compared to the predicted voltage.

A sneak path is a conductive path from one row (e.g., the row depicted in FIG. 2) to an adjacent row (e.g., this additional row added in FIG. 3) that would distort the voltage and/or current on that adjacent row. But, the only way one row can provide a sneak path to another row is via one or more of the posts. Sneak paths occur when nodes are allowed to float or are only weakly driven. If, on the other hand, the post is driven from a low impedance source (i.e., strongly driven relative to the potential loading from any of the rows), the ability for any given row to influence any other row by way of a sneak path through one or more posts is greatly limited. If a given memory element assumption is incorrect, leaking current will flow as described above to or from the unselected posts and this will cause the voltages on those posts to be shifted (i.e., increased or decreased, respectively). The extent of this voltage shift is a function of the impedance of the voltage sourced to the post. If the post (along with any voltage driving circuitry) has low impedance, the impact of the leaking current will be smaller than if the post has a high impedance. By minimizing the impact of the leaking currents by making the posts lower impedance, one will necessarily be minimizing the impact of the sneak paths. In other words, by driving/clamping every unselected post to its calculated voltage, the sneak path is substantially limited. This can be achieved by placing a current driving device at each post or by ensuring that the impedance of the post (and any circuitry to assert that voltage on that post) is much small than the impedance of the memory elements connected to that post (when they are at their worst case—lowest resistance—state). When there is no driving element, the number of layers will be reduced as dictated by this difference between the memory elements' impedance and the post's impedance.

It should be noted that, since the posts are common to all of the layers (i.e., all of the rows), the voltage applied to the posts will be the same for all of the layers/rows. Since the voltage calculated for each unselected post is a function of the resistance value assumed for the selected memory element on the row, the same resistance must be assumed for the selected memory element between a selected post and each level (i.e., to each row) for a given set of computed unselected post voltages.

With some resistance memory elements such as phase-change memory elements (comprising a Chalcogenide alloy material such as GST), once a threshold voltage across the memory element is exceeded, the element exhibits a snapback action and its resistance drops (in some cases to only 1000 to 2000 ohms or less). With a 3-5-5 GST material, this snapback occurs at approximately 1V. To program or erase such a memory element, the calculation outlined above would be repeated to determine the voltages along row (A) while assuming that the voltage across the selected memory element is to be the threshold voltage (e.g., 1.0V, or slightly greater, as opposed to the 0.5V in the above example) and that the resistance of the memory element is to be at its lowest resistance value prior to exhibiting snapback (in the example above, this resistance was 10KΩ). If the assumption of the element's resistance is incorrect (i.e., the element's resistance is greater), the voltage across that element will be higher, but still less than the voltage calculated to be on the end of row (A) at the op-amp. When the voltage is applied and the element exhibits snapback, the resistance will drop and the voltage across the element will collapse while the current will increase. With the above example, the post 16 memory element of 10KΩ at the threshold voltage of 1V (the current through the element would be 100 µA while the op-amp voltage would be have to be approximately 1.00032V) will snap to an approximate range of 2KΩ (at 0.499 mA) to 1KΩ (at 0.997 mA) and all of the voltages along row (A) would correspondingly drop. With an op-amp voltage of 1.00032V and a resistance per segment of 0.2Ω, the voltage on the row at post 1 and post 15 would be roughly 1.00022V and 0.99882V respectively, with each post point in between being determined according to Ohm's law. If the posts were biased to these after-snapback voltages, then each unselected memory element would have zero volts across it following snapback.

In practice, the op-amp circuit could be designed to adjust these voltages automatically when snapback occurs while incorporating a current limiting and shaping circuit to provide the desired programming or erasing waveform, as is well understood by those skilled in the art of analog design.

Figure 4:
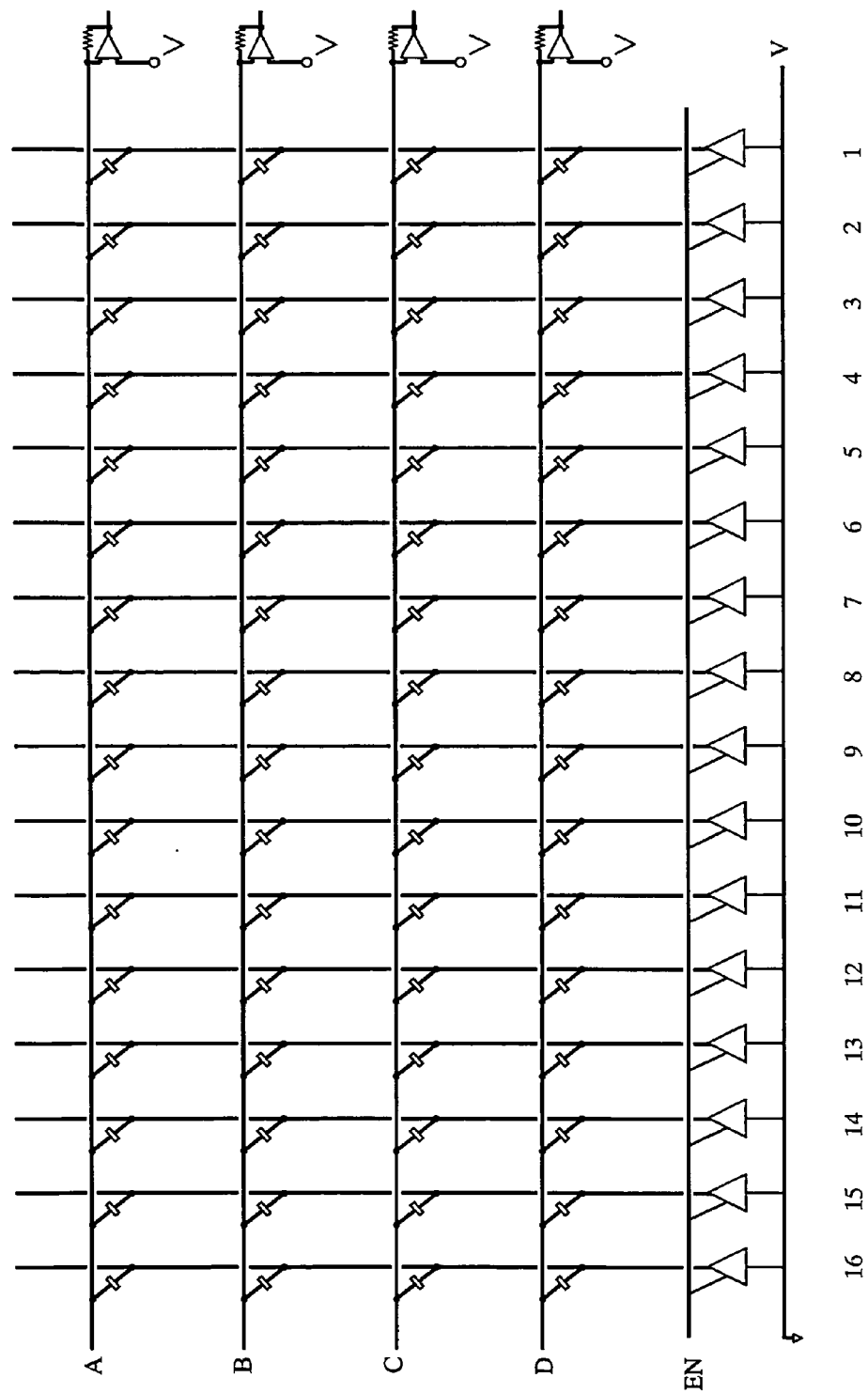
FIG. 4 depicts a schematic for a row-plane showing four rows and 16 posts with post drivers driven from a reference row.

A reference voltage for each post can be generated from a resistive line (the reference line) having one end asserted at the op-amp voltage and a second point asserted at the selected post voltage at a point along its length proportional to the point along the length of the row to where the selected post is located. Voltage taps can then be drawn off this resistive line at points corresponding to each post. This resistive line would typically have a conductivity that is the same as one of the row lines or that is proportional to a row line (in this latter case, the tap points will be proportionally adjusted along this resistive line). A voltage follower can be utilized at each tap point having a high impedance input from the tap point, to minimize loading the tap on the reference line and distorting the voltages generated therein, and having a low impedance output to drive the voltage to the post, as depicted in FIG. 4 (with the reference line grounded by post 16 for when post 16 is selected). This will give the correct slope for the voltages across the line as well as an approximately close absolute reference voltage for each unselected post (noting that the absolute voltages must also allow for the voltage drop across the selected memory element and the selected post, but these voltage drops can be compensated for in the voltage follower design and it, along with its variations, will be clear to those skilled in the art). For the highest memory bit packing density, a vertically constructed switch or transistor (as are known in the prior art) in the base of each post is desired, where the circuit for generating the intermediate voltages from a reference line can be positioned at the edge of the 3-D array at the ends of the columns.

When reading and erasing, all of the memory bits connected to the selected post are equals; that is to say, all the elements will be read or all the elements will be erased and all the elements can be treated equally. This also means that all of the reference voltages adjacent to the unselected posts will be the same on each layer. As a result, erasing can be performed similarly to reading in that one selected post will be pulled to ground and all of the rows will be raised to a voltage such that, when allowing for the voltage drop along the row as described above, the voltage across the selected memory element (bit) will be the desired erase voltage; the unselected posts will be biased accordingly so that the voltage across the unselected bits is at or near zero volts (0v). When applying an erase pulse that is shaped (e.g., a pulse that ramps down over time), the input to the reference voltage generator must be likewise shaped so that the bias voltage on each unselected post will track the waveform on the row at each unselected post.

Figure 9:
FIG. 9 is a graph depicting voltages on the columns and on a selected Row while erasing.
Figure 10:
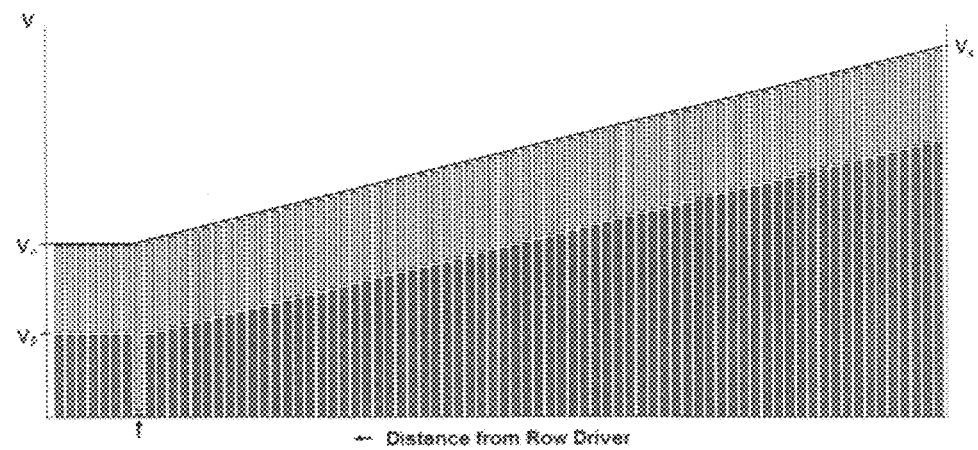
FIG. 10 is a graph depicting voltages on the columns and on a selected Row while programming in a three-dimensional array.

However, during programming, this is not the case. When programming a memory cell, operation proceeds in the same manner, except that the voltage $V_R$ is increased to a programming voltage level, $V_P$ (see FIG. 9 as compared to FIG. 7). As is depicted in this graph, the voltage across the memory elements at the unselected columns remains small because the bias voltages on these unselected columns are correspondingly raised along with $V_P$. (Note that FIG. 7 and FIG. 9 are not necessarily to scale, but they do reflect the greater programming voltage, $V_P$.)

During programming, some bits may need to be programmed while others may need to be left unchanged. When an erased bit is being programmed, the voltage $V_X$ applied to that row will be selected such that the voltage at the selected post will result in the programming voltage $V_P$ being applied across the memory element to be programmed. The unselected posts could be biased to those reference voltages that would put 0v across each unselected memory element. However, if all the unselected posts are biased such that there is 0v across the unselected memory elements for a layer that is being programmed, since the post bias voltages are the same layer-to-layer, a different layer that is not being programmed and for which the row voltage, $V_P$ (or $V_{P-bar}$), is lower (e.g., a row voltage closer to the level used during reading—a voltage that will not cause the snapback threshold to be exceeded across the memory element at the selected post) would see a large reverse voltage across those memory elements. Alternatively, the post bias voltages could be set to those voltages used for reading and any row on which the memory element is not being programmed could be set to the voltage used when reading, then the voltage on the rows on which the memory elements are being programmed would be set higher (such that the programming voltage $V_P$ will be applied across the memory elements to be programmed), but this will put a high forward voltage across those unselected memory elements on the layers to be programmed. Both of these cases are acceptable as long as the voltages across the unselected memory elements in either case do not exceed the snapback threshold voltage (a write disturb will occur if the snapback voltage across an unselected memory element is exceeded). If a memory element material is used that requires a very large programming voltage $V_P$ or which has a very low snapback threshold voltage such that the application of the required programming voltage would cause the snapback threshold to be exceeded on any of the unselected memory elements, a different memory element material would have to be substituted. However, if between these two approaches (namely to bias the unselected posts for zero volts across the unselected memory elements connected to the layer being programmed or to bias the unselected posts for zero volts across the unselected memory elements connected the layer not being programmed, as just described above) the threshold voltage is not exceeded, on average, across the unselected memory elements, the unselected posts can be biased to voltages that fall between the voltage that would result in zero volts across the unselected memory elements on a layer being programmed and the voltage that would result in zero volts across the unselected memory elements on a layer not being programmed. Either of these voltages or any ones in between can be generated as described above with regard to FIG. 4 and the generation of the post biasing references voltages.

The present invention is well suited for use as a three-dimensional resistive array. With a three-dimensional structured resistive array, each information storage element could be formed in series with a voltage threshold device such as an Ovonic Threshold Switch (OTS) to improve the noise margin.

An alternative approach for reading is to apply the calculated post voltage to every post (including the post to be selected) and measure the output from the op-amp. Once this output value is sampled, the selected post is pulled to ground and the output (the result voltage) is compared to the sampled voltage. If this technique is combined with a resistance selection for the memory element assumption that is roughly the average of the possible high and low resistance values for that memory element, the result voltage will be greater than the sampled voltage for one bit state and lower for the other bit state.

If more than two states are possible, such as with a multi level cell (MLC) type memory element, multiple assumptions could be tested during a read operation or this could be accomplished by ramping the assumed voltage for the selected post.

At the start of an erase operation having a shaped erase pulse, the op-amps could continue to hold the rows to V potential and all posts could be brought to and held at V potential. Then a post could be lowered to a voltage that will cause the memory elements to erase which could include pulsing this voltage low and ramping it high as would be done with a GST type memory element. With this approach, all of the memory elements on that post will be erased simultaneously. Also, the reference voltages will be constant while the selected post would change according to the desired pulse shape. The impedance of the row lines with their respective op-amp drivers will determine how many posts can be operated simultaneously during an erase cycle and, as long as the rows and the unselected posts can be held high (or high enough to prevent the voltage across a memory element not being erased from exceeding the threshold voltage), more posts can be added to the erase operation. It should also be noted that if the impedance of the posts is too high, the current entering the post from a first row upon which an erase cycle is being performed can raise the voltage on that post and could impact the ability to place the necessary threshold voltage across the memory element connecting that post with a second row; as a result, to activate an additional row during an erase cycle, the voltage on that additional row may have to be shifted in order to ensure the necessary voltage potential is achieved across the additional memory element.

Programming and erasing often utilizes higher currents and with some materials (such as GST) must exceed the material threshold. When the material threshold is exceeded (snapback), the resistance drops and the voltage across the material will collapse. This will result in higher currents in the circuit and lower voltages along the row line. Programming multiple bits at once can be difficult if one bit exhibits snapback (thereby causing the voltage across that bit to collapse and the voltages along the row to drop) ahead of other bits intended to be programmed at the same time. It is worthy to note that during a read operation the assumed resistance for a selected memory element can vary by a few orders of magnitude (e.g., with 3-3-5 GST, the high resistance can be on the order of mega-ohms whereas the low resistance can be as low as several kilo-ohms or a variability factor of as much as 1000×), during a write or erase operation this error is potentially much smaller (e.g., following snapback, the memory element will be in a single state—post-snapback—where the resistance is approximately one to two kilo-ohms or a variability factor of about 2×); in other words, during write and erase operations, the memory element is generally known whereas during read operations, a high or low resistance state must be assumed and this assumption, necessarily, will often be the wrong state.

Also, Chalcogenide alloys such as 3-3-5 GST can be programmed by a narrow pulse (as short as roughly 10 nSec long) and erased by a long pulse (e.g., a few 100 nSec), but the amplitude of the long pulse can have as much as a 20% lower voltage. This is because the narrow pulse functions to melt the GST and, once melted, is terminated as quickly as possible so as to leave that memory element in a high resistance, amorphous state. The long pulse, however, is used to restore the crystalline state of the memory element and functions to anneal the material; as such, the voltage need not be so high as to melt the material, but rather just high enough to provide the energy necessary for the atoms in the material to move back to a crystalline state. Because of this difference in voltage amplitude of the two pulses, it will be desirable to reverse the purpose of these two pulses. Instead of using the long pulse with the lower voltage to erase the memory element and the short pulse with the higher voltage to program the memory element, one could relax the voltages required to individually program the bits of a resistive array by reversing the meaning of the pulses (i.e., using the short pulse with the higher voltage to erase the memory element and the long pulse with the lower voltage to program the memory element). While this will result in slower programming because of the use of the longer pulse, the voltages in the resistive array while programming will be lower thereby providing less chance that a memory bit connected to that post that is not being programmed (i.e., that should remain in the reset state) or that any other memory bit in the resistive array will suffer a write disturb (i.e., have its state be inadvertently changed). Erasing is then performed with the short, higher voltage pulse. But during an erase function, since all bits on a selected post are erased simultaneously, this higher voltage is less likely to cause any bit to be disturbed.

The foregoing description of an example of the preferred embodiment of the invention and the variations thereon have been presented for the purposes of illustration and description. It is not intended to be exhaustive or to limit the invention to the precise forms disclosed. Many modifications and variations are possible in light of the above teaching. It is intended that the scope of the invention be limited not by this detailed description.

I claim:

1. A method for accessing a two-dimensional memory array within a three-dimensional or multi-dimensional memory array comprising a plurality of conductive posts, a conductive selection line having a determinate resistivity per unit length, and a plurality of memory elements, the memory elements having a first contact connected to said conductive selection line and a second contact connected to a respective conductive post, comprising the steps of:
   i. identifying a memory element to be accessed,
   ii. determining the voltage on said conductive selection line at the first contact of the memory element to be accessed,
   iii. biasing the conductive post corresponding to the memory element to thereby cause a current to flow in the memory element,
   iv. estimating a plurality of different voltages generated on said conductive selection line at other memory elements between said memory element to be accessed and the end of the conductive selection line where a voltage is applied,
   v. biasing the conductive posts corresponding to other memory elements between said memory element to be accessed and said end of the conductive selection line where a plurality of different voltages are applied to approximately the plurality of different voltages estimated to be generated on said conductive selection line at said other memory elements to thereby cause no current to flow in said other memory elements.

2. The method of claim 1 further comprising estimating a resistance or equivalent value for a memory element when calculating a voltage.

3. The method of claim 2 whereby the estimated resistance or equivalent value is approximately the greatest value typically encountered for a memory element.

4. The method of claim 2 whereby the estimated resistance or equivalent value is approximately the least value typically encountered for a memory element.

5. The method of claim 2 whereby the estimated resistance or equivalent value is approximately midway between the greatest and the least value typically encountered for a memory element.

6. The method of claim 2 further comprising measuring a current to determine a bit state.

7. A three dimensional information storage device comprising a plurality of two-dimensional arrays whereby at least one two-dimensional array comprises:
   i. a first plurality of conductive lines that are connected to current controlling devices in the substrate and generally perpendicular to the substrate surface,
   ii. a second plurality of conductive lines that have a determinate resistivity per unit length and that are orthogonal to the first set of conductive lines and that are generally parallel to the substrate surface, and
   iii. a plurality of information storage elements, each being proximate to a point of intersection of the first and second sets of conductive lines, the information storage elements having a first contact connected to one line of said second plurality of conductive lines and a second contact connected to one line of said first plurality of conductive lines, whereby accessing an information storage element comprises the steps of:
  a. identifying an information storage element to be accessed,
  b. determining the voltage on one line of said second plurality of conductive lines at the point of the first contact of the information storage element to be accessed,
  c. biasing the one line of said second plurality of conductive lines corresponding to the point of the first contact to thereby cause a current to flow in the information storage element,
  d. estimating a plurality of different voltages generated on said one line of said second plurality of conductive lines at other information storage elements between said information storage element to be accessed and the end of one line of said second plurality of conductive lines where a voltage is applied,
  e. biasing to approximately said plurality of different estimated voltages those lines of the first plurality of conductive lines that are connected to the second contact of the other information storage elements between said information storage element to be accessed and said end of one line of said second plurality of conductive lines where a voltage is applied to thereby cause no current to flow in said other information storage elements.

8. The three dimensional information storage device of claim 7 whereby the two-dimensional arrays are generally parallel to each other.

9. The three dimensional information storage device of claim 7 whereby the first plurality of conductive lines comprises a selected line and a plurality of unselected lines whereby, when an information storage element is being accessed, the lines of the plurality of unselected lines are biased such that there is little or no voltage difference between a given unselected line and the voltage on a line of the second set of conductive lines at the point where said line of the second set of conductive lines passes said unselected line.

10. The three dimensional information storage device of claim 9 whereby, when an information storage element is being accessed, a voltage is applied to the selected line such that current will flow through the information storage element being accessed.

11. The three dimensional information storage device of claim 7 whereby the information storage element comprises a phase-change material.

12. The three dimensional information storage device of claim 11 whereby the phase-change material comprises a Chalcogenide alloy.

13. The three dimensional information storage device of claim 12 whereby the Chalcogenide alloy comprises GST.

* * * * *